(12) United States Patent
Yamaguchi et al.

(10) Patent No.: US 6,887,397 B2
(45) Date of Patent: May 3, 2005

(54) PIEZOELECTRIC/ELECTROSTRICTIVE MATERIAL AND PROCESS FOR PRODUCTION THEREOF

(75) Inventors: Hirofumi Yamaguchi, Komaki (JP); Takaaki Koizumi, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 6 days.

(21) Appl. No.: 10/325,643

(22) Filed: Dec. 19, 2002

(65) Prior Publication Data

US 2003/0146406 A1 Aug. 7, 2003

Related U.S. Application Data

(63) Continuation-in-part of application No. 10/151,462, filed on May 20, 2002, now Pat. No. 6,702,952.

(30) Foreign Application Priority Data

Dec. 19, 2001 (JP) ........................ 2001-385733

(51) Int. Cl.$^7$ .......................... H01L 4/187; C04B 35/49
(52) U.S. Cl. .................. 252/62.9 R; 501/138
(58) Field of Search ...................... 501/138; 252/62.9 R

(56) References Cited

U.S. PATENT DOCUMENTS

2003/0114295 A1 * 6/2003 Yamaguchi et al. ........ 501/137

FOREIGN PATENT DOCUMENTS

| JP | 03-112858 A1 | 5/1991 |
|---|---|---|
| JP | 05-213666 A1 | 8/1993 |
| JP | 05-213669 A1 | 8/1993 |
| JP | 08-198675 A1 | 8/1996 |
| JP | 10-203867 A1 | 8/1998 |
| JP | 2001-089230 A1 | 4/2001 |

* cited by examiner

*Primary Examiner*—C. Melissa Koslow
(74) *Attorney, Agent, or Firm*—Burr & Brown

(57) ABSTRACT

A piezoelectric/electrostrictive material is made of a $BaTiO_3$-based porcelain composed mainly of $BaTiO_3$, and a strain ($S_{4000}$) of transversal direction is $650 \times 10^{-6}$ or more in an electric field of 4,000 V/mm. This porcelain has a Curie temperature of 110 to 130° C., and its crystal phase at ambient temperature consists essentially of tetragonal and cubic phases. The piezoelectric/electrostrictive material being composed of this porcelain is superior in strain to conventional products, and can be suitably used in an actuator or a sensor.

22 Claims, 1 Drawing Sheet

PIEZOELECTRIC/ELECTROSTRICTIVE MATERIAL AND PROCESS FOR PRODUCTION THEREOF

CROSS-REFERENCE TO RELATED APPLICATION

This is a continuation-in-part application of U.S. patent application Ser. No. filed on May 20, 2002, U.S. Pat. No. 6,702,952, the entirety of which is incorporated herein by reference.

BACKGROUND OF THE INVENTION AND RELATED ART STATEMENT

The present invention relates to a piezoelectric/electrostrictive material made of a porcelain obtained by firing, for example, to a piezoelectric/electrostrictive material used as an actuator or a sensor both assembled as an electromechanical transducer for positioning in precision machine tool or length control of optical path in optical instrument or in valve for flow rate control, etc. More particularly, the present invention relates to a piezoelectric/electrostrictive material suitably used in a very small sensor or a highly integrated very small actuator both used in an element for measurement of liquid property or very small weight.

As piezoelectric/electrostrictive materials, there have been known $Pb(Zr,Ti)O_3$ (hereinafter referred to as PZT), $BaTiO_3$, etc. They are in use in actuators, filters, various sensors, etc. PZT type piezoelectric/electrostrictive materials have been used mainly because they are superior in overall piezoelectric properties.

Pb contained in PZT, etc. is stabilized and essentially generates no problem caused by decomposition or the like. However, there are cases that a Pb-free material is required depending upon its application. Further, since Pb-containing porcelains such as PZT, PLZT $[(Pb,La)(Zr,Ti)O_3]$ and the like give rise to vaporization of small amount of Pb in high-temperature firing, they have had, particularly when used in applications requiring a thin or thick film, a problem that they hardly show stable properties owing to the compositional change during firing.

Meanwhile, $BaTiO_3$ contains no Pb and offers a promising material for such a need. $BaTiO_3$ viewed as a piezoelectric/electrostrictive material, however, is inferior in piezoelectric/electrostrictive properties to a PZT type material, and has seldom been used as an actuator or as a sensor. Therefore, the present invention has been made in view of the above-mentioned problems of the prior art and aims at providing a $BaTiO_3$-based piezoelectric/electrostrictive material which is superior in piezoelectric/electrostrictive properties to conventional products and which can be suitably used in an actuator or a sensor, and a process for producing such a piezoelectric/electrostrictive material.

SUMMARY OF THE INVENTION

A piezoelectric/electrostrictive material, when used in an actuator, is required to show a large displacement to a voltage applied. The present inventors have found that a piezoelectric/electrostrictive material showing a large displacement can be obtained by optimizing the composition for $BaTiO_3$-based porcelain, as a result of an intensive study made on the piezoelectric/electrostrictive characteristics. Furthermore, the present inventors have found that a piezoelectric/electrostrictive material showing a large displacement can be obtained, by controlling the fine structure of $BaTiO_3$-based porcelain, particularly the distribution of the crystal grain constituting the $BaTiO_3$-based porcelain. These findings have led to the completion of the present invention.

According to the present invention, there is provided a piezoelectric/electrostrictive material made of a $BaTiO_3$-based porcelain composed mainly of $BaTiO_3$ and containing CuO and $Nb_2O_5$, characterized in that strain of transversal direction is $650\times10^{-6}$ or more in an electric field of 4,000 V/mm.

According to the present invention, there is provided a piezoelectric/electrostrictive material made of a $BaTiO_3$-based porcelain composed mainly of $BaTiO_3$ and containing CuO and $Nb_2O_5$, characterized in that a Curie temperature of the porcelain is 110 to 130° C.

According to the present invention, there is provided a piezoelectric/electrostrictive material made of a $BaTiO_3$-based porcelain composed mainly of $BaTiO_3$ and containing CuO and $Nb_2O_5$, characterized in that crystal phase of the porcelain at ambient temperature consists essentially of tetragonal phase and cubic phase.

In the piezoelectric/electrostrictive material of the present invention, at least part of the Ba may be substituted with Sr. Also in the present invention, the Ba/Ti (molar ratio) or the (Ba+Sr)/Ti (molar ratio) is preferably in a range of 1.001 to 1.02, more preferably in a range of 1.001 to 1.01 because such a molar ratio can easily prevent the growth of abnormal grains occurring during the firing for porcelain formation and can easily control the particle diameters of the crystal grains constituting the porcelain. Furthermore, according to the present invention, there is also provided a process for producing a piezoelectric/electrostrictive material made of a $BaTi_{O3}$-based porcelain composed mainly of $BaTiO_3$ and containing CuO and $Nb_2O_5$, characterized by weighing individual raw materials so as to give a predetermined composition, mixing and grinding them, calcinating the resulting mixed powder in the air at 850 to 950° C., then grinding the resulting calcinated material until the ground material comes to have a specific surface area of 7 $m^2$/g or less, and molding and firing the ground material.

It is further preferable for the provision of a piezoelectric/electrostrictive material having a higher strain to subject the thus obtained porcelain to a heat treatment, with a decreasing temperature speed of 50 to 200° C./hr until the temperature reaches 50° C(. or less.

DESCRIPTION OF PREFERRED EMBODIMENTS

Figure 1:
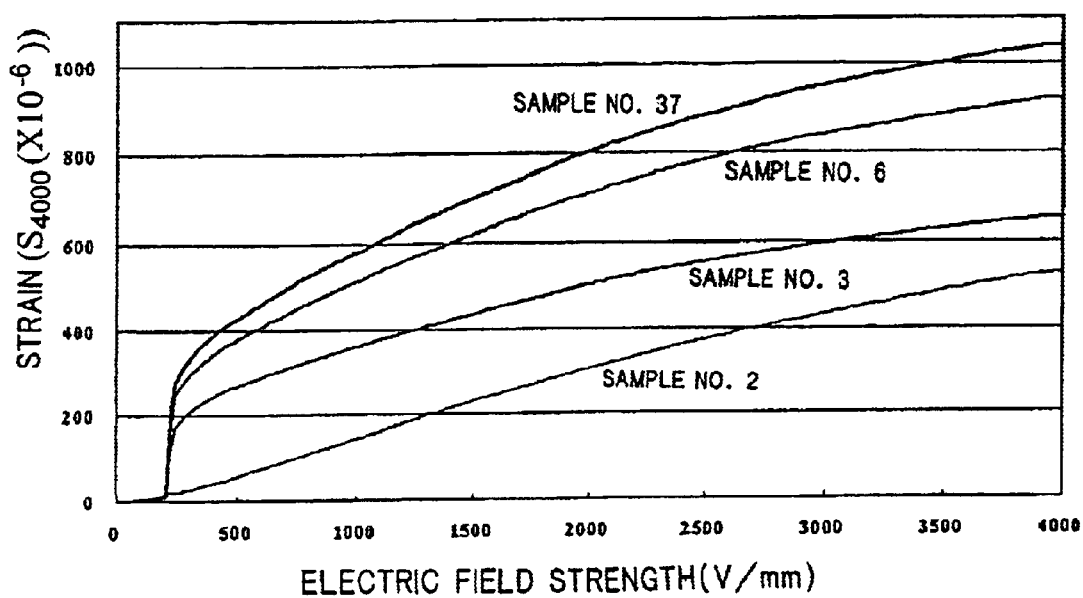
FIG. 1 is a graph showing the strain ($S_{4000}$) (ppm) of transversal direction when an electric field of 4,000 V/mm was applied in the thickness direction.

The piezoelectric/electrostrictive material according to the present invention is described in more detail below. The piezoelectric/electrostrictive material according to the present invention is made of a $BaTiO_3$-based porcelain composed mainly of $BaTiO_3$ and containing CuO, $Nb_2O$, etc.

A specific composition of the porcelain of the present invention may be such wherein $BaTiO_3$ is the main component and part of the Ba, for example, 0.1 to 10 mole % may be substituted with Sr. Also, the porcelain of the present invention may inevitably contain Zr, Si, Al, etc. in an amount of 0.5% by weight or less based on the total weight. Further in the BaTiO$_3$-based porcelain of the present invention, the A/B=(Ba+Sr)/Ti (molar ratio), is preferably larger than 1, exemplarily, preferably in a range of 1.001 to 1.02, more preferably in a range of 1.001 to 1.01. Also, to the present porcelain are preferably added Nb$_2$O$_5$ and CuO each in an amount of 0.05 to 0.5% by weight, more preferably each in an amount of 0.1 to 0.3% by weight as a superaddition. Further, to the porcelain of the present invention may be added rare earth metals and/or transition metals other than the above components, in a total amount of 0.5% by weight or less in terms of their metal oxides. Incidentally, the forms of the components added are ordinarily oxides, carbonates or sulfates thereof.

The individual crystal grains constituting the porcelain of the present invention have crystal lattices of perovskite structure. And the porcelain of the present invention is one having a strain of transversal direction is 650×10$^{-6}$ or more, preferably 700×10$^{-6}$ or more, more preferably 800×10$^{-6}$ in an electric field of 4,000 V/mm. Specifically mentioning, the present porcelain is a material having a characteristic electric field—strain curve, as mentioned hereinafter. The porcelain of the present invention is characterized in that it has a Curie temperature of 110 to 130° C., and that crystal phase of the porcelain at ambient temperature consists essentially of tetragonal phase and cubic phase. Moreover, the porcelain of the present invention has a dielectric constant value of 2000 to 3000 at ambient temperature. In the case of the porcelain of the present invention mentioned above, it has also the characteristics in the distribution of the particle diameter constituting the respective crystal grains. Concretely, 85% or more of the crystal grains are constituted by grains having particle diameters of 10 μm or less and the maximum particle diameter of the grains is in a range of 5 to 25 μm. In a preferred particle diameter distribution of the crystal grains, 90% to less than 100% of the crystal grains have particle diameters of 10 μm or less and the maximum particle diameter of the grains is in a range of 10 to 25 μm.

The action mechanism for why a porcelain having the above characteristic properties shows superior piezoelectric/electrostrictive properties, is not clear. However, from the results shown in Examples described later, it is clear that porcelain constituted by crystal grains having the above-mentioned range of Curie temperature, the above-mentioned crystal phases, and a particle diameter distribution in the above-mentioned range is superior in piezoelectric/electrostrictive properties.

Next, description is made on the process for producing a piezoelectric/electrostrictive material according to the present invention.

First, raw materials (oxides, hydroxides and carbonates of metal elements) are weighed as so as to give a compositional range of the present invention and are mixed using a mixer such as ball mill or the like. In this mixing, it is preferred to allow the primary particles of each raw material after mixing to have particle diameters of 1 μm or less, in order to allow the porcelain obtained to have a particle diameter distribution specified in the present invention. Then, the resulting mixed powder is calcinated in the air at 850 to 950° C. to obtain a calcinated material. An appropriate calcination temperature is 850 to 950° C. With a calcination temperature above 950° C., the resulting sintered material is nonuniform and, with a calcination temperature below 850° C., an unreacted phase remains in the resulting sintered material, making it impossible to obtain a dense porcelain.

Next, the calcinated material obtained is ground using a grinder such as ball mill or the like until the ground material comes to have a specific surface area of preferably 7 m$^2$/g or less, more preferably 5 m$^2$/g or less. The ground material is molded by a monoaxial press and then by a hydrostatic press to obtain a molded material of desired shape. The molded material is fired at 1,100 to 1,250° C. to obtain a sintered material. The most appropriate firing temperature is 1,150 to 1,200° C.

In the above-mentioned production process, it is important to control the Ba/Ti ratio of BaTiO$_3$ [the (Ba+Sr)/Ti ratio when part of the Ba has been substituted with Sr] depending upon the kinds and amounts of the components (e.g. CuO and Nb$_2$O$_5$) added to the main component BaTiO$_3$. The Ba/Ti (molar ratio) [or the (Ba+Sr)/Ti (molar ratio)] is appropriately controlled so that an intended crystal grain diameter distribution can be obtained depending upon the amounts and forms (e.g. salt or metal) of the components added, the firing temperature, etc.

The sintered material (porcelain) obtained by firing sufficiently shows a high strain property. In the present invention, one may attain a further high strain property by subjecting the thus obtained porcelain to a heat treatment with rising temperature to a maximum temperature of 150° C. to 600°C., and maintaining it at the maximum temperature for 1 to 180 minutes, and thereafter with decreasing temperature at the rate of 50 to 200° C./hr until the temperature reaches 50° C. or less.

The piezoelectric/electrostrictive material according to the present invention is superior in displacement property; therefore, it is useful as a general electromechanical transducer and is suitably used in an actuator, a sensor, etc.

The present invention is described specifically below by way of Examples.

EXAMPLE 1

BaCO$_3$, TiO$_2$, Nb$_2$O$_5$, SrCO$_3$ and CuO all as starting materials were weighed in such a manner that the substitution amount of Sr for Ba, the A/B=[(Ba+Sr)/Ti (molar ratio)], and the contents of Nb$_2$O$_5$ and CuO were shown in Table 1 as the composition for the respective porcelain. 150 Grams of these raw materials each were subjected to wet mixing of 64 hours using 400 g of a solvent and zirconia balls of 2 mm in diameter as a medium, by the use of a ball mill, to allow the raw materials to have primary particle diameters of 1 μm or less.

The resulting mixture was dried and then subjected to a calcination treatment in the air at 900° C. for 2 hours. The resulting calcinated material was subjected to a grinding treatment in a ball mill. In the grinding treatment, the amount of zirconia balls, the grinding time, etc. were appropriately controlled to obtain a powder after grinding treatment (the powder is hereinafter referred to as ground powder) having a specific surface area of 5 m$^2$/g. The specific surface area of the ground powder was measured by a BET method. Then, a polyvinyl alcohol as a binder was added to the ground powder. The mixture was molded into a shape of 20 mm in diameter and 15 mm in height using a monoaxial press molding machine and a hydrostatic press molding machine.

Next, the molded material obtained above was fired in the air at a firing temperature of 1,100 to 1,250° C. for a firing time of 3 hours to obtain a porcelain. A scanning electron micrograph was taken for the porcelain; from the micrograph were calculated diameters of equivalent area circles to use them as the diameters of the individual grains constituting the porcelain; from these diameters, the proportions of the individual particles were determined based on their area.

Moreover, the crystal phase constituting each porcelain was examined by X-ray diffraction method.

The porcelain was processed to obtain a rectangular sample of 12 mm in length, 3 mm in width and 1 mm in thickness. After an electrode was formed on the surface of thus obtained sample having a length of 12 mm and a width of 3 mm, the resultant sample was subjected to a polarization treatment in the thickness direction under the conditions of 70° C., 2,000 V and 15 minutes. After the polarization treatment, the electrode was allowed to stand for 100 hours and measured for transversal strain ($S_{4000}$) (ppm) when a voltage of 4,000 V/mm was applied in the thickness direction, using a strain gauge. Simultaneously, piezoelectric constant $d_3$, was measured by a resonance-antiresonance method, using an impedance analyzer. The results are shown in Table 1. Incidentally, * mark in Table 1 indicates Comparative Example. Additionally, T denotes tetragonal phase, and C denotes cubic phase.

Ba was substituted with Sr, the A/B molar ratio [(Ba+Sr)/Ti] became 1.005, and the contents of $Nb_2O_5$ and CuO became 0.1% by weight and 0.2% by weight, respectively, as a superaddition. Those materials were mixed in the same manner as that for Example 1.

The resulting mixture was subjected to a calcination treatment in the same manner as that for Example 1, and the specific surface area of the powders after grinding treatment was adjusted as shown in Table 2.

Then, each of molded article materials was formed by forming using ground material, the molded materials obtained above were fired at a firing temperature shown in Table 2 to obtain a porcelain in the same manner as that for Example 1.

After having been subjected to a polarization treatment in the same manner of Example 1, strain ($S_{4000}$) of transversal direction in an electric filed of 4,000 V/mm and piezoelectric

TABLE 1

| Sample No. | (Ba + Sr)/Ti Molar ratio | Substitution Amount of Sr (mole %) | Addition amount of CuO (wt %) | Addition amount of $Nb_2O_5$ (wt %) | Firing Temp. (° C.) | $S_{4000}$ ($\times 10^{-6}$) | $d_{31}$ (pm/V) | Crystal phase |
|---|---|---|---|---|---|---|---|---|
| 1* | 1 | 0 | 0 | 0 | 1200 | Not sintered | — | — |
| 2* | 1 | 0 | 0 | 0 | 1300 | 520 | 60 | C |
| 3 | 1 | 0 | 0.2 | 0.1 | 1200 | 650 | 34 | T + C |
| 4* | 0.95 | 0 | 0.2 | 0.1 | 1200 | 400 | 80 | T |
| 5 | 1.001 | 0 | 0.2 | 0.1 | 1200 | 790 | 32 | T + C |
| 6 | 1.005 | 0 | 0.2 | 0.1 | 1200 | 920 | 11 | T + C |
| 7 | 1.01 | 0 | 0.2 | 0.1 | 1200 | 800 | 28 | T + C |
| 8 | 1.02 | 0 | 0.2 | 0.1 | 1200 | 740 | 41 | T + C |
| 9* | 1.1 | 0 | 0.2 | 0.1 | 1200 | Dielectric breakdown | — | — |
| 10 | 1.01 | 0.1 | 0.2 | 0.1 | 1200 | 810 | 36 | T + C |
| 11 | 1.01 | 1 | 0.2 | 0.1 | 1200 | 850 | 35 | T + C |
| 12 | 1.01 | 5 | 0.2 | 0.1 | 1200 | 810 | 35 | T + C |
| 13 | 1.01 | 10 | 0.2 | 0.1 | 1200 | 800 | 35 | T + C |
| 14 | 1.01 | 20 | 0.2 | 0.1 | 1200 | 740 | 38 | T + C |
| 15 | 1.005 | 0 | 0 | 0.1 | 1200 | 600 | 54 | T |
| 16 | 1.005 | 0 | 0.05 | 0.1 | 1200 | 750 | 25 | T + C |
| 17 | 1.005 | 0 | 0.1 | 0.1 | 1200 | 910 | 18 | T + C |
| 18 | 1.005 | 0 | 0.3 | 0.1 | 1200 | 900 | 11 | T + C |
| 19 | 1.005 | 0 | 0.5 | 0.1 | 1200 | 850 | 23 | T + C |
| 20 | 1.005 | 0 | 1 | 0.1 | 1200 | 700 | 37 | T + C |
| 21 | 1.005 | 0 | 0.2 | 0 | 1200 | 520 | 75 | T |
| 22 | 1.005 | 0 | 0.2 | 0.05 | 1200 | 750 | 33 | T + C |
| 23 | 1.005 | 0 | 0.2 | 0.3 | 1200 | 900 | 12 | T + C |
| 24 | 1.005 | 0 | 0.2 | 0.5 | 1200 | 760 | 41 | T + C |
| 25 | 1.005 | 0 | 0.2 | 1 | 1200 | 700 | 48 | T + C |
| 26 | 1.005 | 0 | 0.2 | 2 | 1200 | None-piezoelectric | — | C |

Among the porcelains obtained in Example 1, Curie temperature of all the porcelains except the samples for Comparative Examples were measured, and found that every porcelain measured showed a Curie temperature within a range of 110° C. to 130° C.

As is clear from the results shown in Table 1, in the case of the porcelains of the present invention, a strain (ppm) in the transversal direction in an electric field of 4000 V/mm is $650 \times 10^{-6}$ or more, piezoelectric constant in the thickness direction, $d_{31}$ (pm/V) is relatively low, and the crystal phase at ambient temperature consists essentially of tetragonal and cubic phase.

EXAMPLE 2

The same starting materials as those for Example 1 were used, and they were weighed so that the composition of the porcelain to be obtained became such in which 1 mole % of constant $d_{31}$ were measured. The results are shown in Table 2. Incidentally, * mark in Table 2 indicates Comparative Example.

When the relationship between the electric field strength of up to 4000 V/mm and the strain was investigated as to Sample NO.2 (Comparative Example), Sample NO.3, Sample NO.6, and Sample NO.37, it has been found that Sample NO.3, Sample NO.6, and Sample NO.37 have such a characteristic electric field—strain curve that no strain was observed until certain electric field strength, but that a big strain was observed suddenly when the electric field strength exceeded a certain level.

The strain ($S_{4000}$) was determined as to Sample No. 36, Sample No. 37, Sample No. 38, after those samples were subjected to a heat treatment wherein the obtained porcelains were kept at temperature of 150° C. for 30 minutes, then temperature was decreased to 50° C. at a decreasing speed of 200° C./hr. The temperature increasing speed was set at 200° C./hr, when the heat treatment was carried out.

TABLE 2

| Sample No. | (Ba + Sr)/Ti Molar ratio | Substitution amount of Sr (mol %) | Addition amount of CuO (wt %) | Addition amount of Nb$_2$O$_5$ (wt %) | Specific surface area of ground powder (m$^2$/g) | Firing temp. (° C.) | Proportion of grains of 10 μm or less (%) | Maximum particle diameter (μm) | S$_{4000}$ (×10$^{-6}$) (ppm) | d$_{31}$ (pm/V) | S$_{4000}$ after heat treatment |
|---|---|---|---|---|---|---|---|---|---|---|---|
| 27 | 1.005 | 1 | 0.2 | 0.1 | 10 | 1100 | 85 | 22 | 710 | 40 | |
| 28* | 1.005 | 1 | 0.2 | 0.1 | 10 | 1150 | 72 | 39 | 600 | 68 | |
| 29* | 1.005 | 1 | 0.2 | 0.1 | 10 | 1200 | 56 | 48 | 600 | 80 | |
| 30* | 1.005 | 1 | 0.2 | 0.1 | 10 | 1250 | 43 | 100 | 540 | 85 | |
| 31* | 1.005 | 1 | 0.2 | 0.1 | 7 | 1100 | 100 | 4 | 580 | 47 | |
| 32 | 1.005 | 1 | 0.2 | 0.1 | 7 | 1150 | 100 | 9 | 870 | 28 | |
| 33 | 1.005 | 1 | 0.2 | 0.1 | 7 | 1200 | 99 | 14 | 980 | 31 | |
| 34* | 1.005 | 1 | 0.2 | 0.1 | 7 | 1250 | 84 | 26 | 620 | 89 | |
| 35* | 1.005 | 1 | 0.2 | 0.1 | 5 | 1100 | 100 | 4 | 560 | 53 | |
| 36 | 1.005 | 1 | 0.2 | 0.1 | 5 | 1150 | 100 | 6 | 790 | 38 | 860 |
| 37 | 1.005 | 1 | 0.2 | 0.1 | 5 | 1200 | 92 | 21 | 1040 | 13 | 1150 |
| 38 | 1.005 | 1 | 0.2 | 0.1 | 5 | 1250 | 86 | 22 | 830 | 43 | 910 |
| 39* | 1.005 | 1 | 0.2 | 0.1 | 3 | 1100 | 100 | 3 | 430 | 21 | |
| 40 | 1.005 | 1 | 0.2 | 0.1 | 3 | 1150 | 95 | 12 | 980 | 43 | |
| 41 | 1.005 | 1 | 0.2 | 0.1 | 3 | 1200 | 90 | 16 | 1010 | 32 | |
| 42 | 1.005 | 1 | 0.2 | 0.1 | 3 | 1250 | 85 | 19 | 810 | 53 | |

As is clear from the results shown in Table 2, it has been found to be preferable for the provision of a piezoelectric/electrostrictive material having a high strain to control and adjust that the specific surface area of ground powder after calcination is 7 m$^2$/g or less, 85% or more of the crystal grains constituting the material are grains having particle diameters of 10 μm or less, and the maximum particle diameter of the grains is in a range of 5 to 25 μm.

Furthermore, it has been found that the strain property (S$_{4000}$) can be further improved by subjecting the obtained porcelain to a heat treatment.

As described above, the piezoelectric/electrostrictive material of the present invention is superior in piezoelectric/electrostrictive properties to conventional products, and it can be suitably used in an actuator or a sensor.

What is claimed is:

1. A piezoelectric/electrostrictive material comprising a BaTiO$_3$-based porcelain composed mainly of BaTiO$_3$ and containing CuO and Nb$_2$O$_5$, characterized in that a strain (S$_{4000}$) of transversal direction is 650×10$^{-6}$ or more, in an electric field of 4,000 V/mm.

2. A piezoelectric/electrostrictive material comprising a BaTiO$_3$-based porcelain composed mainly of BaTiO$_3$ and containing CuO and Nb$_2$O$_5$, characterized in that it has a Curie temperature of 110 to 130° C.

3. A piezoelectric/electrostrictive material comprising a BaTiO$_3$-based porcelain composed mainly of BaTiO$_3$ and containing CuO and Nb$_2$O$_5$, characterized in that crystal phase of the porcelain at ambient temperature consists essentially of tetragonal phase and cubic phase.

4. A piezoelectric/electrostrictive material according to claim 1, wherein at least part of the Ba is substituted with Sr.

5. A piezoelectric/electrostrictive material according to claim 1, wherein at least part of the Ba is substituted with Sr.

6. A piezoelectric/electrostrictive material according to claim 3, wherein at least part of the Ba is substituted with Sr.

7. A piezoelectric/electrostrictive material according to claim 1, wherein a Ba/Ti molar ratio is 1.001 to 1.02.

8. A piezoelectric/electrostrictive material according to claim 2, wherein a Ba/Ti molar ratio is 1.001 to 1.02.

9. A piezoelectric/electrostrictive material according to claim 3, wherein a Ba/Ti molar ratio is 1.001 to 1.02.

10. A piezoelectric/electrostrictive material according to claim 4, wherein a (Ba+Sr)/Ti molar ratio is 1.001 to 1.02.

11. A piezoelectric/electrostrictive material according to claim 5, wherein a (Ba+Sr)/Ti molar ratio is 1.001 to 1.02.

12. A piezoelectric/electrostrictive material according to claim 6, wherein a (Ba+Sr)/Ti molar ratio is 1.001 to 1.02.

13. A piezoelectric/electrostrictive material according to claim 1, wherein a content of CuO is 0.05 to 0.5 wt %, and a content of Nb$_2$O$_5$ is 0.05 to 0.5 wt %.

14. A piezoelectric/electrostrictive material according to claim 2, wherein a content of CuO is 0.05 to 0.5 wt %, and a content of Nb$_2$O$_5$ is 0.05 to 0.5 wt %.

15. A piezoelectric/electrostrictive material according to claim 3, wherein a content of CuO is 0.05 to 0.5 wt % and a content of Nb$_2$O$_5$ is 0.05 to 0.5 wt %.

16. A piezoelectric/electrostrictive material according to claim 1, wherein 85% or more of the crystal grains constituting the porcelain are grains having particle diameters of 10 μm or less and the maximum particle diameters of the grains is in a range of 5 to 25 μm.

17. A piezoelectric/electrostrictive material according to claim 2, wherein 85% or more of the crystal grains constituting the porcelain are grains having particle diameters of 10 μm or less and the maximum particle diameters of the grains is in a range of 5 to 25 μm.

18. A piezoelectric/electrostrictive material according to claim 3, wherein 85% or more of the crystal grains constituting the porcelain are grains having particle diameters of 10 μm or less and the maximum particle diameters of the grains is in a range of 5 to 25 μm.

19. A piezoelectric/electrostrictive material according to claim 4, wherein 85% or more of the crystal grains constituting the porcelain are grains having particle diameters of 10 μm or less and the maximum particle diameters of the grains is in a range of 5 to 25 μm.

20. A piezoelectric/electrostrictive material according to claim 5, wherein 85% or more of the crystal grains constituting the porcelain are grains having particle diameters of 10 μm or less and the maximum particle diameters of the grains is in a range of 5 to 25 μm.

21. A piezoelectric/electrostrictive material according to claim 6, wherein 85% or more of the crystal grains constituting the porcelain are grains having particle diameters of 10 μm or less and the maximum particle diameters of the grains is in a range of 5 to 25 μm.

22. A process for producing a piezoelectric/electrostrictive material made of a BaTiO$_3$-based porcelain composed mainly of BatiO$_3$ and containing CuO and Nb$_2$O$_5$, comprising the steps of weighing individual raw materials, to give a predetermined composition, mixing and grinding said raw materials, calcinating the resulting mixed powder in air at 850 to 950° C., grinding the resulting calcinated material until the ground material comes to have a specific surface area of 7 m$^2$/g or less, molding and firing the ground material to form said porcelain, and, subjecting said porcelain to a heat treatment wherein a temperature is increased up to a maximum temperature of 150° C. to 600° C., and this temperature is kept for 1 to 180 minutes, and thereafter the temperature is decreased to 50° C. or less at a decreasing speed of 50 to 200° C./hr.

* * * * *

UNITED STATES PATENT AND TRADEMARK OFFICE
CERTIFICATE OF CORRECTION

PATENT NO.    : 6,887,397 B2
DATED         : May 3, 2005
INVENTOR(S)   : Hirofumi Yamaguchi and Takaaki Koizumi It is certified that error appears in the above-identified patent and that said Letters Patent is hereby corrected as shown below:

Column 1,
Line 9, add -- 10/151,462 -- after "Ser. No." and add -- now -- after "2002,".

Column 2,
Line 9, add -- ($S_{4000}$) -- after "strain".
Line 50, delete "(ppm)" after "($S_{4000}$)".

Column 3,
Line 18, add -- ($S_{4000}$) -- after "strain".

Column 5,
Lines 11 and 56, delete "(ppm)" after "($S_{4000}$)".
Table 1, 1st column (Sample No.), add -- * -- after "15", "21" and "26".

Column 7,
Table 2, 10th column, delete "(ppm)" under "$S_{4000}$ (x10$^{-6}$)".
Lines 40, 45, 49, change "comprising" to -- made of --.
Line 57, change "claim 1" to -- claim 2 --.

Column 9,
Line 1, change "BatiO$_3$" to -- BaTiO$_3$ --.
Line 3, delete "," after "materials".

Signed and Sealed this

Twenty-fourth Day of January, 2006

JON W. DUDAS
*Director of the United States Patent and Trademark Office*